United States Patent
Knee

(10) Patent No.: US 6,731,136 B2
(45) Date of Patent: May 4, 2004

(54) DIFFERENTIAL CMOS LOGIC WITH DYNAMIC BIAS

(75) Inventor: Derek Knee, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 135 days.

(21) Appl. No.: 10/002,813

(22) Filed: Nov. 1, 2001

(65) Prior Publication Data

US 2003/0080779 A1 May 1, 2003

(51) Int. Cl.[7] ............... H03K 19/0175; H03K 19/00; H03L 5/00
(52) U.S. Cl. .................. 326/83; 326/103; 327/333
(58) Field of Search ................. 326/80–83, 86–87, 326/101, 103; 327/333, 563

(56) References Cited

U.S. PATENT DOCUMENTS

| | | |
|---|---|---|
| 5,149,992 A | 9/1992 | Allstot et al. |
| 5,432,114 A | 7/1995 | O |
| 5,451,898 A * | 9/1995 | Johnson ............... 327/563 |
| 5,777,515 A * | 7/1998 | Kimura ................ 330/257 |
| 6,218,858 B1 * | 4/2001 | Menon et al. ........... 326/39 |
| 6,225,830 B1 | 5/2001 | Ra |
| 6,452,422 B1 * | 9/2002 | Suzuki ................ 326/112 |
| 6,486,821 B1 * | 11/2002 | Aude et al. ........... 341/172 |
| 2002/0140692 A1 * | 10/2002 | Sandhu et al. ......... 345/418 |

FOREIGN PATENT DOCUMENTS

| | | |
|---|---|---|
| EP | 0387999 A2 | 9/1990 |
| EP | 0898370 A1 | 2/1999 |
| JP | 07074556 A | 3/1995 |

* cited by examiner

Primary Examiner—James H Cho

(57) ABSTRACT

A CMOS circuit arrangement. In this arrangement, relatively thick oxide devices are fabricated along with relatively thin oxide devices on the same chip. High speed logic circuits are fabricated with thin oxide devices as differential logic operating with a low voltage swing. A current source is fabricated using thick oxide devices to drop a large percentage of the supply voltage, protecting the thin oxide devices from damage caused by large voltage swings. An adaptive bias control circuit receives inputs from the logic circuit or elsewhere to control the bias current available from the current source to permit larger currents to pass through the current source at switching times.

18 Claims, 1 Drawing Sheet

DIFFERENTIAL CMOS LOGIC WITH DYNAMIC BIAS

FIELD OF THE INVENTION

This invention relates generally to the field of complementary metal oxide semiconductor (CMOS) bias techniques. More particularly, in certain embodiments, this invention relates to a dynamic bias arrangement for CMOS using current steering logic that is particularly applicable to large scale integration.

BACKGROUND OF THE INVENTION

The trend for a number of years in fabrication of CMOS integrated circuits is toward fabrication of transistors having smaller geometries and thinner gate oxides. These smaller geometries permit faster operation of the circuits and provide for more efficient manufacturing by permitting larger numbers of circuits to be placed on each semiconductor wafer.

Unfortunately, this trend is not without disadvantages. For example, as the geometries of the circuits decrease, the ability of the circuit to withstand large rail-to-rail voltage swings diminishes and the thinner gate oxides of the individual transistor devices exhibit problems with tunneling at a lower voltage. This in turn complicates retention of a standard supply voltage for a particular device or generation of devices. Thus, in order to provide more advanced circuitry operating at higher speeds, more advanced CMOS devices (which are generally operated as rail-to-rail output logic devices) with smaller geometries have required circuitry to adapt to earlier established voltage supplies, or else a new generation of devices operating at lower supply voltages, had to be defined. Thus, in order to advance the state of the art, earlier defined standards on power supply voltage had to be abandoned in favor of newer standards, providing little stability of supply voltage requirements across process generations.

BRIEF SUMMARY OF THE INVENTION

The present invention relates generally to a CMOS logic circuitry. Objects, advantages and features of the invention will become apparent to those skilled in the art upon consideration of the following detailed description of the invention.

In certain embodiments consistent with the present invention, a CMOS circuit arrangement is provided in which relatively thick oxide devices are fabricated along with relatively thin oxide devices on the same chip. High speed logic circuits are fabricated with thin oxide devices as differential logic operating with a low voltage swing. A current source is fabricated using thick oxide devices to drop a large percentage of the supply voltage, protecting the thin oxide devices from damage caused by large voltage swings. An adaptive bias control circuit receives inputs from the logic circuit or elsewhere to control the bias current available from the current source to permit larger currents to pass through the current source at switching times.

A CMOS circuit fabricated using a process that can create thick oxide transistors and thin oxide transistors, consistent with an embodiment of the present invention has a differential logic circuit fabricated of thin oxide transistors, and having a plurality of inputs. A current source supplies bias current to the differential logic circuit, the current source being fabricated using at least one thick oxide transistor.

Another CMOS circuit fabricated using a process that can create thick oxide transistors and thin oxide transistors, consistent with an embodiment of the present invention has a differential logic circuit fabricated of thin oxide transistors, and having a plurality of inputs. A current source, supplies bias current to the differential logic circuit, the current source being fabricated using at least one thick oxide transistor, and the current source having a control input that can determine how much current is available to source to the differential logic circuit. An adaptive bias control provides a control signal at the control input of the current source to selectively control the bias current available to the differential logic circuit.

Another CMOS circuit fabricated using a process that can create thick oxide transistors and thin oxide transistors, consistent with an embodiment of the present invention has a differential logic circuit fabricated of thin oxide transistors, and having a plurality of inputs, the differential logic circuit comprising a pair of matched thin oxide transistors configured as a differential inverter. A current source, supplies bias current to the differential logic circuit, the current source comprising a thick oxide transistor receiving a supply voltage at a drain thereof and coupling a reduced supply voltage to the differential logic circuit through a source thereof, and the current source having a control input at a gate thereof that can determine how much current is available to source to the differential logic circuit. An adaptive bias control provides a control signal at the control input of the current source to selectively control the bias current available to the differential logic circuit.

Many variations, equivalents and permutations of these illustrative exemplary embodiments of the invention will occur to those skilled in the art upon consideration of the description that follows. The particular examples above should not be considered to define the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
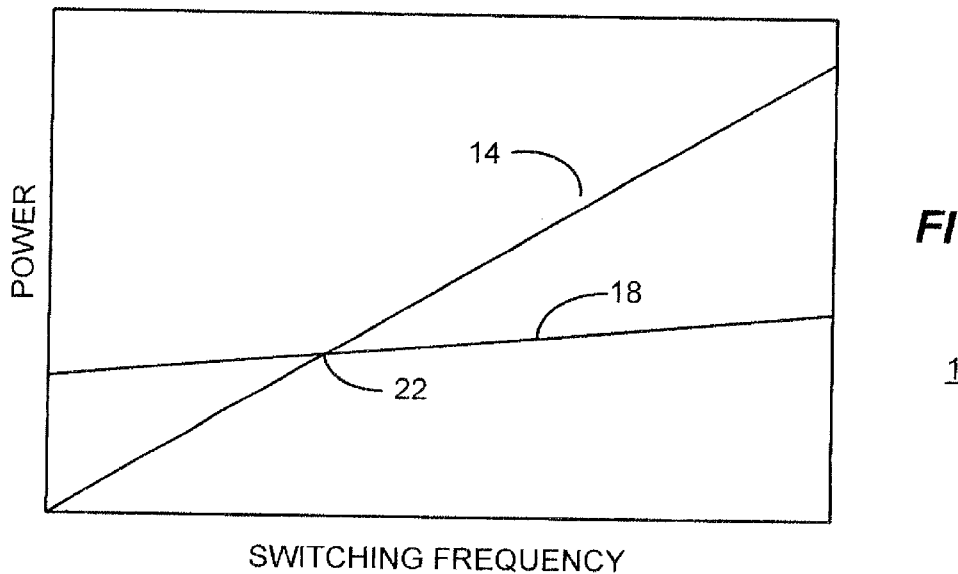
FIG. 1 is a graph of power consumption for rail-to-rail CMOS logic and low voltage swing differential logic.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Before describing the invention in detail, it is helpful to define several terms for purposes of this document. The present invention is applicable to CMOS circuits fabricated using a process wherein two types of CMOS transistors can be fabricated. The absolute processing parameters are, in general, unimportant, but the relative characteristics of the two types of transistors are important. The first type of transistor is fabricated using a relatively thick oxide layer and the second type of transistor is fabricated using a relatively thin oxide layer. The fact that the first type uses a relatively thick oxide layer means that it is capable of withstanding higher voltages without tunneling (or other damage) than the second type can. The first type is also inherently larger and slower than the second type. The second type inherently has a lower tolerance to voltage before tunneling occurs, but is capable of operating at higher switching speeds and has a higher transconductance $g_m$ (note that $g_m$ is approximately inversely proportional to the oxide thickness). For purposes of this document, the two types of transistor devices need not be characterized by their exact geometries, since that is subject to change as processing technologies advance, but rather by their relationship to one another. Thus, if a CMOS circuit is fabricated such that two or more different thicknesses of oxide transistor devices are produced, the thicker transistor devices are referred to herein as a thick oxide transistor devices and a thinner transistor devices are referred to as a thin oxide transistor device.

By way of example, and not limitation, the present invention may be applicable to a process that produces transistor devices with gate length having approximately 0.25 micron geometry as well as transistor devices having approximately 0.1 micron geometry. In this example, the thick oxide devices may be capable of handling relatively high rail-to-rail voltage swings on the order of 2.5 volts, whereas, the thin oxide devices may only be able to handle voltage swings on the order of 1.0 volt. Nevertheless, for purposes of the present invention, the thick oxide transistor device would be considered to be a high voltage device and the thin oxide transistor device would be considered a low voltage device. The relative transconductance of the two devices is such that the transconductance of the thin oxide transistor device is much higher than that of the thick oxide transistor device and the operating speed of the thin oxide device can be made to be much higher than that of the thick oxide device.

Thus, for purposes of this document, the exact dimensions and other parameters are unimportant and the terms "thin" and "thick" in this context are intended to be by this definition relative terms for devices fabricated using a semiconductor manufacturing process capable of fabricating both relatively thick and relatively thin oxide transistors, when viewed in comparison with one another.

Turning now to FIG. 1, a graph 10 illustrates the power consumption of a CMOS integrated circuit as a function of frequency as curve 14. Curve 14 is approximately a straight line function describing the operation of conventional rail-to-rail static CMOS logic circuitry that illustrates that the current consumed by the circuit is approximately proportional to the switching frequency. The power consumed is approximately zero if no switching is taking place. As the frequency of switching increases, the current required to charge the circuit's equivalent capacitance C results in a consumption of power P that is approximately given by the following equation:

$$P = V_{dd}^2 \cdot f \cdot C$$

where f is the switching frequency and $V_{dd}$ is the peak-to-peak power supply voltage.

Thus, conventionally operated CMOS circuitry consumes power proportional to the operational speed. Curve 18 illustrates operation of CMOS circuitry in a differential low voltage swing mode. In this mode, differentially connected transistors are connected to fabricate logic gates and do not switch the full range of the supply voltage. When operated in this configuration, the logic gates do not fully turn off when the gates are inactive. Thus, at zero frequency and low frequencies, the power consumption is greater than that of conventional rail-to-rail CMOS. Conventional wisdom, thus suggests that in order to conserve power, conventional CMOS should be used operating rail-to-rail. However, as operational frequencies cross point 22 of graph 10, this advantage no longer exists.

Additionally, there becomes a point where the switching threshold of transistors used to fabricate high switching speed rail-to-rail CMOS using gate thin oxide devices is dangerously close to potential noise on the ground or supply lines. Normal variations in the fabrication process can exacerbate this problem. Moreover, as the supply voltage is further reduced, an output from one CMOS logic device might fail to drive another CMOS logic device due to normal processing variations affecting the threshold switching voltage.

Figure 2:
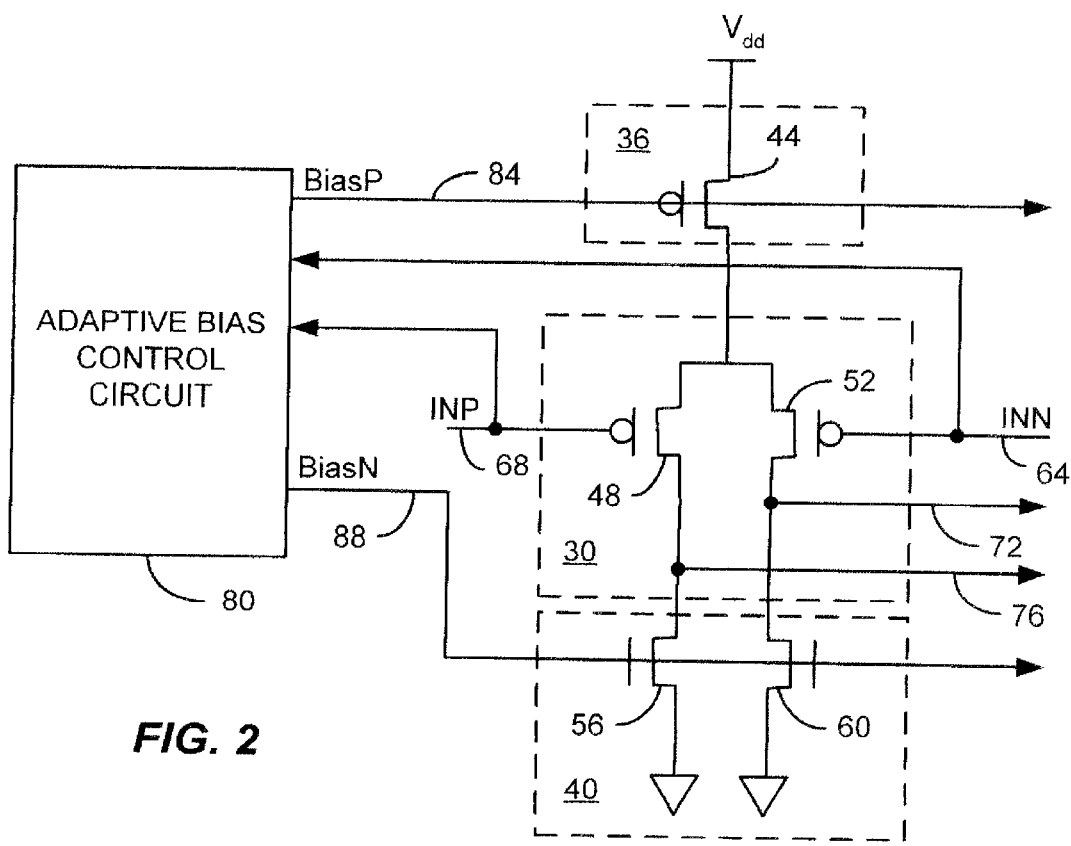
FIG. 2 is a combined schematic and block diagram of a current steered dynamic bias arrangement for a CMOS logic circuit consistent with an embodiment of the present invention.

As the state of the art advances, it is therefore worth considering breaking the conventional paradigm of rail-to-rail CMOS circuit design. Accordingly, FIG. 2 illustrates an exemplary circuit configuration that illustrates the concept of the present invention to provide an adaptive bias control for a logic circuit. In this illustrative example, a logic gate 30 configured as a differential inverter circuit is used to represent any configuration of logic gates, registers, flip flops, etc. Logic circuit 30 receives bias voltage and current through a current source 36 and drives a bias load circuit 40.

As previously discussed, the present invention is realized by way of a fabrication process which provides for the ability to fabricate CMOS transistor devices as either thick oxide transistor devices (capable of relatively high voltage, but comparatively slow) or thin oxide transistor devices (with relatively high switching speed, relatively high transconductance $g_m$, but relatively low maximum voltage swing). In this case, the current source is fabricated using one or more thick oxide transistor devices such as transistor 44. Logic device 30 (as a representative of many such logic devices) is fabricated using thin oxide transistors such as 48 and 52. The bias load circuit, as represented by transistors 56 and 60 connected from the sources of transistors 48 and 52 respectively to ground, may be fabricated as either thick oxide or thin oxide transistors, or may even be a passive device such as a resistor without departing from the invention.

As will be clear to those skilled in the art, transistors 48 and 52 have inputs 64 and 68 designated INN and INP respectively that are driven by a differential logic signal to produce an inverted differential output signal taken between output nodes 72 and 76, which may in turn drive other logic circuits. The logic circuit 30 is biased in such a manner to operate on a small voltage swing that is within the tolerable voltage swing of the thin oxide transistors 48 and 52. Using differential logic inherently provides a measure of common mode noise immunity to the devices so that ground noise and supply noise becomes less relevant than if the same gates were implemented with the same voltage swing, but using a single ended design. In this embodiment, the differential peak-to-peak output voltage swing between 72 and 76 might be less than 300 mV and in the range of 100 to 300 mV, while still retaining high noise immunity, but this should not be considered limiting. The transistors 48 and 52 (and other such differential pairs forming a part of any logic circuit represented by circuit 30) are preferably closely matched in geometry and located physically close together so that the transistors remain closely matched in electrical characteristics (including but not limited to switching voltage) over normal variations in processing parameters.

In this circuit configuration, a relatively large portion of supply voltage $V_{dd}$ can be dropped across the current source 36. This allows the differential logic circuits represented by 30 to operate as low voltage swing differential logic. The small geometry of the transistors making up circuit 30 permits high speed operation.

In order to assure that the logic circuit 30 (and other logic circuits represented by circuit 30) receive an appropriate amount of bias to operate at high speed, and also to permit control over power consumption, certain embodiments of the present invention further contemplate that the current drive to logic circuit 30 can be controlled in a dynamic manner using a current steering technique. In this embodiment, a representative input line or a plurality of input lines (e.g., 64 and 68) can be provided to an adaptive bias control circuit 80. Bias control circuit 80 receives these signals as input and determines therefrom that there is a need for increased switching current to the transistors of the logic circuit 30 at the time the input signals from 64 and 68 are received. The adaptive bias control circuit then supplies a bias control signal BiasP shown as 84 to the current source 36 to permit the current source 36 to provide more instantaneous current to the logic circuit 30. In certain embodiments, adaptive bias control circuit 80 may also provide a similar bias control signal BiasN shown as 88 to a control input of the bias load circuit 40 to permit the bias load circuit 40 to provide additional sinking current to the logic circuit 30 when the inputs are active (switching).

In the embodiment illustrated in FIG. 2, both BiasP and BiasN signals 84 and 88 may be signals that lower the voltage present on the gates of transistors 44, 56 and 60 to turn these transistors on somewhat harder than their normal quiescent state and thus provide the additional switching current needed by transistors 48 and 52 at the moment of switching to permit high speed operation. In a simple implementation of the adaptive bias control circuit, the transitions occurring at inputs INP 68 and INN 64 may be capacitively coupled into the adaptive bias control circuit 80 to provide a signal that can be used, for example, to turn on a transistor within the adaptive bias control circuit 80 to momentarily drive the BiasP line 84 lower. This transistor, or another, can similarly be used to momentarily drive the BiasN line 88 higher if desired to simultaneously increase both current source and current sink. In an even simpler example, capacitive coupling can be supplied directly from the input nodes 64 and/or 68 directly to the BiasP line 84 and possibly the BiasN line 88 to momentarily provide additional bias current to the logic circuit 30. Those skilled in the art will appreciate that many other circuit configurations can be readily devised to accomplish this desired end result.

FIG. 2 illustrates all inputs of logic circuit 30 (as a representative gate for a more complex circuit arrangement of potentially many gates) and in one embodiment of the present invention, all inputs to all such gates, are coupled to the adaptive bias control circuit 80 to provide dynamic adjustment of bias current. However, this is not to be considered limiting. In other embodiments, inputs driving adaptive bias control circuit 80 could be a selected representative set of gate inputs, or the input from a clock signal that is present at all gate transitions could be used to provide the necessary information to permit adaptive bias control circuit 80 to provide the additional momentary bias current needed by the logic circuit. Other variations will occur to those skilled in the art without departing from the present invention.

By segregation of the current source 30 into multiple similar current sources, operating with multiple control signals BiasP, it is also possible, consistent with certain embodiments of the present invention, to impose external control through the adaptive bias control circuit or otherwise, to selectively reduce the current (and thus the power consumed) to logic circuits such as 30 that are either currently idle or currently operating at a reduced frequency. It is also possible to completely cut off certain portions of logic circuitry by application of control to the BiasP and BiasN signals to clamp the control inputs at a voltage adequate to turn off transistors 44, 56 and 60.

The present invention also provides stability of power supply voltages over multiple generations of logic devices. Since the current source operates at a higher voltage than the actual logic devices, it is possible to change the operational parameters of the logic devices (e.g., 30) as a result of improvements in technology that permit faster operation, without changing the overall supply voltage that is mostly absorbed by the current source 36. Since the thick oxide transistors of the current source do not have to operate at the same speed as the logic circuits 30, similar devices can be used across several generations of changes in the geometry or other parameters of the transistors making up the differential logic circuits. Since the power supply can remain relatively high (compared to the voltage swing of the logic circuit transistors, interfacing with external components is simplified over circuitry that requires a low power supply voltage.

The logic design techniques described above have a further advantage over rail-to-rail swing CMOS logic when comparing the power supply routing constraints on the chip. The differential current steering logic draws a constant current from the power supply network on the chip as compared to the rail-to-rail CMOS logic, which draws supply current in the form of spikes. These current spikes cause perturbations in the power supply network due to its resistance and inductance parasitic components. The constant power supply current draw of the differential logic does not cause these perturbations and therefore results in either a more stable power supply voltage or it can result in the design of a less constrained power supply network which has more resistance and or inductance. The differential logic is more tolerant of power supply network parasitic issues.

While the invention has been described in conjunction with specific embodiments, it is evident that many alternatives, modifications, permutations and variations will become apparent to those of ordinary skill in the art in light of the foregoing description. By way of example, the polarity of the logic devices and the polarity of signals required to induce the proper bias can be reversed without departing from the invention. Many other variations are also possible. Accordingly, it is intended that the present invention embrace all such alternatives, modifications and variations as fall within the scope of the appended claims.

What is claimed is:

1. A CMOS circuit fabricated using a process that can create thick oxide transistors and thin oxide transistors, comprising:
   a differential logic circuit fabricated of a plurality of thin oxide transistors, and having a plurality of logic inputs;
   a current source, supplying bias current to the differential logic circuit, the current source fabricated using at least one thick oxide transistor and wherein the current source has a control input that can determine how much current is available to source to the differential logic circuit; and
   an adaptive bias control, coupled to at least one of the plurality of logic inputs, and is responsive to a voltage transition on the at least one logic input to provide a control signal at the control input of the current source to increase the bias current available to the differential logic circuit.

2. The CMOS circuit according to claim 1, further comprising means for selectively adjusting an amount of bias current available to the differential logic circuit.

3. The CMOS circuit according to claim 2, wherein the differential logic circuit has a differential output voltage swing of less than 300 mV.

4. The CMOS circuit according to claim 2, wherein the differential logic circuit has a differential output voltage swing of between 100 mV and 300 mV.

5. The CMOS circuit according to claim 2, wherein the differential logic circuit comprises a pair of matched thin oxide transistors of the plurality of thin oxide transistors configured as a differential inverter.

6. The CMOS circuit according to claim 1, further comprising a bias load circuit loading the differential logic circuit.

7. The CMOS circuit according to claim 6, wherein the bias load circuit has a load current control input; and
    wherein the adaptive bias control is responsive to the voltage transition on the at least one logic input to provide a load current control signal at the load current control input of the bias load circuit to increase the bias current through the bias load circuit.

8. The CMOS circuit according to claim 6, wherein the bias load circuit comprises a resistive load.

9. A CMOS circuit fabricated using a process that can create thick oxide transistors and thin oxide transistors, comprising:
    a differential logic circuit fabricated of a plurality of thin oxide transistors, and having a plurality of logic inputs;
    a current source, supplying bias current to the differential logic circuit, the current source fabricated using at least one thick oxide transistor, the current source having a control input that can determine how much current is available to source to the differential logic circuit; and
    an adaptive bias control that provides a control signal at the control input of the current source to selectively control the bias current available to the differential logic circuit, wherein the adaptive bias control is coupled to at least one of the plurality of logic inputs, and is responsive to a voltage transition on the at least one logic input provides a control signal at the control input of the current source to control the bias current available to the differential logic circuit.

10. A CMOS circuit fabricated using a process that can create thick oxide transistors and thin oxide transistors, comprising:
    a differential logic circuit fabricated of a plurality of thin oxide transistors, and having a plurality of logic inputs;
    a current source, supplying bias current to the differential logic circuit, the current source fabricated using at least one thick oxide transistor, the current source having a control input that can determine how much current is available to source to the differential logic circuit;
    an adaptive bias control that provides a control signal at the control input of the current source to selectively control the bias current available to the differential logic circuit;
    a bias load circuit loading the differential logic circuit, wherein the bias load circuit has a load current control input; and
    wherein the adaptive bias control is responsive to the voltage transition on the at least one logic input to provide a load current control signal at the load current control input of the bias load circuit to control the bias current through the bias load circuit.

11. The CMOS circuit according to claim 10, wherein the bias load circuit comprises a resistive load.

12. The CMOS circuit according to claim 10, wherein the differential logic circuit has a differential output voltage swing of less than 300 mV.

13. The CMOS circuit according to claim 10, wherein the differential logic circuit has a differential output voltage swing of between 100 mV and 300 mV.

14. A CMOS circuit fabricated using a process that can create thick oxide transistors and thin oxide transistors, comprising:
    a differential logic circuit fabricated of a plurality of thin oxide transistors, and having a plurality of logic inputs, the differential logic circuit comprising a pair of matched thin oxide transistors configured as a differential inverter;
    a current source, supplying bias current to the differential logic circuit, the current source comprising a thick oxide transistor receiving a supply voltage at a drain thereof and coupling a reduced supply voltage to the differential logic circuit through a source thereof, the current source having a control input at a gate thereof that can determine how much current is available to source to the differential logic circuit; and
    an adaptive bias control that provides a control signal at the control input of the current source to selectively control the bias current available to the differential logic circuit, wherein the adaptive bias control is coupled to at least one of the plurality of logic inputs, and is responsive to a voltage transition on the at least one logic input to provide a control signal at the control input of the current source to control the bias current available to the differential logic circuit.

15. A CMOS circuit fabricated using a process that can create thick oxide transistors and thin oxide transistors, comprising:
    a differential logic circuit fabricated of a plurality of thin oxide transistors, and having a plurality of logic inputs, the differential logic circuit comprising a pair of matched thin oxide transistors configured as a differential inverter;
    a current source, supplying bias current to the differential logic circuit, the current source comprising a thick oxide transistor receiving a supply voltage at a drain thereof and coupling a reduced supply voltage to the differential logic circuit through a source thereof, the current source having a control input at a gate thereof that can determine how much current is available to source to the differential logic circuit; an adaptive bias control that provides a control signal at the control input of the current source to selectively control the bias current available to the differential logic circuit; and
    a bias load circuit loading the differential logic circuit, wherein the bias load circuit has a load current control input; and
    wherein the adaptive bias control is responsive to the voltage transition on the at least one logic input to provide a load current control signal at the load current control input of the bias load circuit to control the bias current through the bias load circuit.

16. The CMOS circuit according to claim 15, wherein the bias load circuit comprises a resistive load.

17. The CMOS circuit according to claim 15, wherein the differential logic circuit has a differential output voltage swing of less than 300 mV.

18. The CMOS circuit according to claim 15, wherein the differential logic circuit has a differential output voltage swing of between 100 mV and 300 mV.

* * * * *